United States Patent [19]

Curtice

[11] 4,147,941
[45] Apr. 3, 1979

[54] TIME DISPLACED SIGNAL SORTING APPARATUS

[75] Inventor: Walter R. Curtice, West Windsor, N.J.

[73] Assignee: RCA Corporation, New York, N.Y.

[21] Appl. No.: 858,291

[22] Filed: Dec. 7, 1977

[51] Int. Cl.² .......................................... H03D 13/00
[52] U.S. Cl. .................................... 307/232; 328/133; 328/157; 328/159; 324/83 D
[58] Field of Search ................ 307/232; 328/133, 158, 328/159, 156, 157; 324/83 D

[56] References Cited
U.S. PATENT DOCUMENTS

| 3,274,514 | 9/1966 | Foulger | 328/158 X |
| 3,328,688 | 6/1967 | Brooks | 328/133 X |
| 3,588,699 | 6/1971 | Pysnik | 328/133 X |
| 3,588,710 | 6/1971 | Masters | 328/133 |
| 3,657,659 | 4/1972 | Johnson | 328/133 |
| 3,755,747 | 8/1973 | Letosky | 307/232 X |

*Primary Examiner*—John S. Heyman
*Attorney, Agent, or Firm*—H. Christoffersen; Joseph D. Lazar; Raymond E. Smiley

[57] ABSTRACT

A circuit is receptive of two time-spaced input signals at two respective input terminals, where either terminal may receive the first arriving input signal, for producing at first and second output terminals, signals indicative respectively of the time of arrival of the first and second input signals.

9 Claims, 1 Drawing Figure

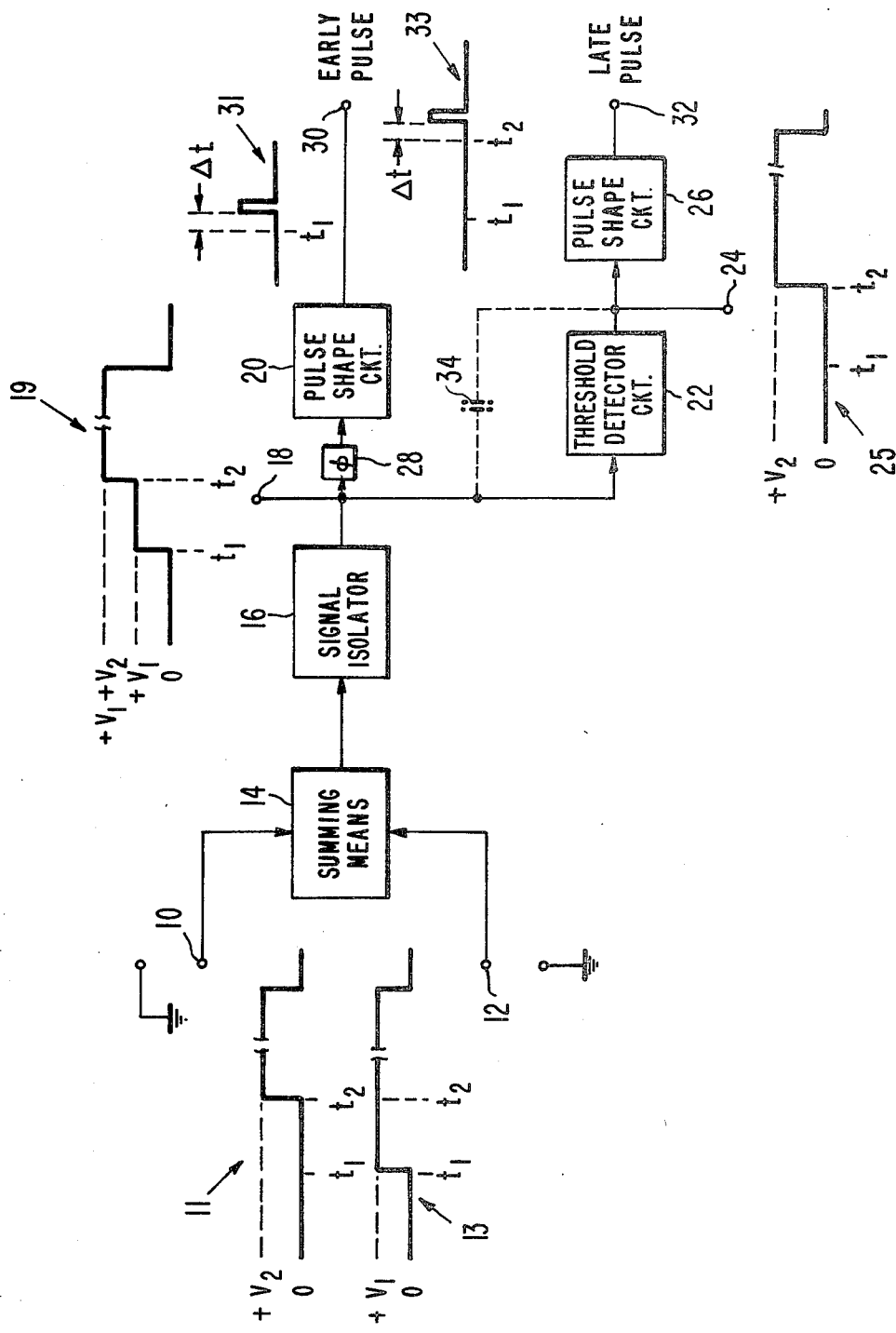

TIME DISPLACED SIGNAL SORTING APPARATUS

The Government has rights in this invention pursuant to Contract No. N00030-75-C-0225 awarded by the Department of the Navy.

BACKGROUND OF THE INVENTION

In some applications such as a difference in time of arrival (DTOA) circuits, measurement of the difference in time of arrival of two signals at respective input terminals is required. Such circuits require that the first arriving signal be applied to one given terminal and that the second arriving signal be applied to the remaining terminal. For description of one such DTOA circuit, reference is made to "The Vernier Time-Measuring Technique" by Robert G. Baron, Proceedings of the IRE, January 1957, pp. 21–30.

In some situations either of the two input signals may be the first to arrive. Therefore, a circuit must be placed ahead of the DTOA circuit to detect the arrival of the first arriving signal and direct an indication of its arrival to the one given terminal of the DTOA circuit and to detect the arrival of the second arriving signal and direct an indication of its arrival to the remaining DTOA terminal.

SUMMARY OF THE INVENTION

A means is receptive of first and second time-spaced input signals of substantially the same value, the first of which must be present when the second arrives, for producing a sum signal which is directly related to the sum of the amplitudes of the two input signals. A means is coupled to the sum producing means for producing at a first output terminal an early pulse corresponding in time to the arrival of the first input signal at the summing means. A threshold detecting circuit is receptive of the summed signal for passing portions thereof corresponding to the presence of only second signal at the summing means. A second means is coupled to the sum producing means for producing at a second output terminal a signal corresponding in time to the arrival of the second input signal at the summing means.

BRIEF DESCRIPTION OF THE DRAWING

The sole FIGURE is a time spaced signal sorting circuit embodying the present invention.

DETAILED DESCRIPTION OF THE PREFERRED EMBODIMENT

Referring to the sole FIGURE input terminals 10 and 12 are coupled to a summing means 14. Terminals 10 and 12 are receptive of two time-spaced signals 11 and 13, respectively from sources (not shown). In one typical application of the invention, the signals 11 and 13 are derived from a direction finding system in which signals from a remote source are received by at least two antenna systems. Each antenna system will respond to the signals in a time frame based on the location of the antenna relative to the source of the signals, and generate a signal corresponding to the relative time of arrival of that signal to a corresponding signal generated by the other antenna system.

A signal having value $+V_1$ is applied to one of the two input terminals 10 or 12 beginning at a time $t_1$. The remaining input signal having value $+V_2$ is applied to the remaining terminal beginning at some later time $t_2$. As illustrated in the sole FIGURE, the first arriving signal (waveform 13) is applied to terminal 12 and the second arriving signal (waveform 11) is applied to terminal 10 but which signal is applied to which terminal is unimportant.

As will be described in more detail below there is a requirement that the first arriving signal remain at some elevated value such as $+V_1$ at the time $t_2$ when the second signal arrives. If the devices producing such time-spaced pulses produce signals which are not concurrently present, intermediate circuitry such as a logic flip-flop or a monostable circuit can easily be added as is known to those skilled in the art. Further, it is desired that the two input signal levels when present be substantially the same. Again if the devices providing the input signals do not provide such equal valued signals, a scaling means may be added prior to one of the input terminals 10 and 12 to provide the required similarity of signal values.

Means 14 may be any of a number of summing devices. One example of a suitable summing device is an operational amplifier having two input resistors of appropriate value connected thereto. Another suitable example is a dual gate transistor circuit. Summing means 14 is coupled to a signal isolator 16 which isolates the two input signals applied at terminals 10 and 12 from circuits which follow signal isolator 16. Signal isolator 16 may not be necessary depending on the nature of summing means 14. For example if summing means 14 is an operational amplifier then signal isolation is automatically provided.

Waveform 19 produced at the output terminal 18 of signal isolator 16 as illustrated comprises a signal which varies from zero volts, through $+V_1$ volts to $V_1+V_2$ volts depending on the input signals at terminals 10 and 12. Terminal 18 is coupled through a delay 28 to means such as a first pulse-shaping circuit 20.

Pulse-shaping circuit 20 produces an output signal (waveform 31) at first output terminal 30, the leading edge of which corresponds in time to the arrival of the first input signal leading edge at either one of terminals 10 or 12. The width of the output pulse 31 is determined by the pulse-shaping circuit 20. The nature of pulse-shaping circuit 20 is such that it is responsive only to the first change of value of the signal at terminal 18 from 0 to $+V_1$ for producing a given length of output signal and is not responsive to further changes in value of the input signal such as to $+V_1+V_2$. Although the output signal at terminal 30 corresponds to the time arrival of the first input signal at time $t_1$, it may be delayed by a small amount of time $\Delta t$ due to delays inherent in the circuit 20 as illustrated, and in practice, in the various ones of elements 14, 16, and 28. A pulse-shaping circuit suitable for use as element 20 is described in "Simpler Digital Circuits in a Snap" by Bernard Siegal in Electronics, vol. 42, No. 12, pp. 105–108, June 9, 1969. The pulse shaping circuit makes use of the fast switching properties of Step Recovery Diodes (SRD), also called "SNAP" diodes. The pulse-shaping circuit 20 may, if desired, also shape the leading edge of the signal received by it where the input waveform, unlike idealized waveform 19, has significant undesired rise time. Terminal 18 as well as being coupled to a pulse shaping circuit 20 is coupled to a second means for producing at a second output terminal a late pulse corresponding in time to the arrival of the second input signal leading edge at terminals 10 or 12. The means comprises a threshold detector circuit 22 series coupled at its output terminal 24 to a pulse shaping circuit 26 which is identical to circuit 20. Threshold detector circuit 22 is adapted to stop passage of all values of signal received by it of values $+V_1$ or less passing only those values greater than $+V_1$. The passing level may be set just slightly greater than $+V_1$ to eliminate passing noise spikes, occurring between times $t_1$ and $t_2$. Circuit 22 may simply consist of a reverse biased diode of speed compatible with the input signals. The diode is reverse biased to some value slightly greater than $+V_1$. For example of Schottky barrier diode which has extremely fast response time may be utilized in circuit 22 and is in fact suitable for use with input signals which are separated by only one half nanosecond in time. Since circuit 22 has an inherent delay, delay 28 is provided to present to the signal at terminal 18 the same delay provided by circuit 22.

Circuit 22 includes some inherent undesirable capacitive coupling of signals from terminal 18 to terminal 24 as illustrated in phantom by a circuit capacitance 34 having the value C. For example, in the case of circuit 22 consisting of a Schottky barrier diode, the diode has measureable junction capacitance for all bias conditions. The capacitance 34 will provide transmission of some signal from terminal 18 to terminal 24 at time $t_1$, the transmission of which is undesirable. The amount of this signal transmission at time $t_1$ must be small enough so that the voltage amplitude of undesired signal at terminal 24 is small in comparison to the voltage amplitude of the desired signal occurring at time $t_2$.

In an application of the signal sorting circuit wherein the rise time of voltage $V_1$ at time $t_1$ at terminal 18 may be very small, the voltage transmitted at time $t_1$ is substantially equal to C times the time derivative of the lead edge of the voltage of value $V_1$ at time $t_1$, times the input resistance of the subsequent stage connected to terminal 24. Because the rise time of the voltage $V_1$ may be short, the time derivative is large and the undesired transmitted signal to terminal 24 may be large. Therefore, the capacitance C must be as small as possible consistent with high degree of signal transmission at time $t_2$ due to voltage $+V_2$.

For example, if circuit 22 consists of a Schottky barrier diode, then a small area diode with small junction capacitance and with minimum packaging capacitance must be used. However, the diode junction area must be large enough to provide low series resistance in the forward conduction state for signal $+V_2$ or else reduction of the desired output signal amplitude will occur.

Circuit 22 is coupled to a pulse-shaping circuit 26 having an output terminal 32 and identical to pulse-shaping circuit 20. Terminal 32 produces an output signal at time $t_2$ plus the same delay time $\Delta t$ as is present at output terminal 30 and thus produces an output pulse the leading edge of which is an indication of the time of arrival of the second arriving signal at summing means 14. The delay time $\Delta t$ is actually produced by time delays present in circuits 14, 16, 22, and 26 or circuits 14, 16, 28, and 20 although it is illustrated in the FIGURE to be due to time delay in circuits 26 or 20 only.

As discussed in the aforementioned article by Siegal, the pulse shaping circuit 26 can sharpen the leading edge of the output pulse by the action of a step recovery diode. This same diode will also function to eliminate any small amplitude undesirable signals proceeding the voltage $+V_2$, such as, for example, the undesired signal at time $t_1$ occurring due to coupling from terminal 18 by means of capacitor 34. However, if the undesired signal is not small in comparison to the desired signal at time $t_2$, then the step recovery diode cannot remove the undesired signal and still properly function to sharpen the leading edge of the desired signal at time $t_2$.

Operation of the circuit is as follows. A signal nominally at value 0 but which rises to value $+V_1$ is applied to terminal 12. At some later time $t_2$, the remaining input signal at terminal 10 also nominally of value 0 rises to value $+V_2$. The time of arrival of the two input signals could be reversed.

Summing means 14 and signal isolator 16 are responsive to the two input signals to produce at terminal 18 a signal which is nominally at 0 volts, rises to $+V_1$ volts at time $t_1$ and rises to $+V_1+V_2$ volts at later time $t_2$. The signal thus appearing at terminal 18 is independent of whether the first signal arrived at terminal 10 or whether the first signal arrived at terminal 12.

Pulse-shape circuitry 20 in series with delay circuit 28 is responsive to a change in input signal at terminal 18 from 0 to $+V_1$ volts for producing a shaped output pulse at terminal 30. The leading edge of this output pulse as illustrated in waveform 31 corresponds substantially in time to the arrival of an input signal at time $t_1$ delayed by an amount $\Delta t$ corresponding to delay in element 20, and in practice to delays in elements 14, 16, and 28. Pulse-shaping circuitry 20 is not responsive to the further rise in signal level to value $+V_1+V_2$. Pulse-shaping circuitry 20 is not responsive to any change in signal level at terminal 18 until the signal has first gone back to value 0 and then risen again to $+V_1$ at some later time (not illustrated).

Threshold detector circuit 22, as described earlier, removes all input voltages at and below the value $+V_1$ and therefore produces at terminal 24 the signal $+V_2$ at time $t_2$ or as shortly thereafter as consistent with delays in summing means 14, signal isolator 16 and the circuit 22. The signal at terminal 24 is applied to pulse-shaping circuit 26 which produces at its output terminal 32 a shaped pulse as illustrated in waveform 33. This pulse appears at time $t_2$ plus some slight delay time $\Delta t$ occasioned by delay in circuit 26 and in practice by delays in various circuits 14, 16, and 22.

The illustrated circuit as described, produces an output signal at terminal 30, the leading edge of which corresponds in time to the arrival of the leading edge of a first arriving input signal at either input terminal 10 or 12 while there is produced at output terminal 32 a signal, the leading edge of which corresponds in time to the arrival of the second arriving input signal at the remaining terminal 12 or 10. Terminals 30 and 32 may be coupled to respective input terminals of a DTOA circuit such as described in the aforementioned article by Robert G. Baron.

It is preferable to provide means for causing $+V_1$ to be equal to $+V_2$ and equal to a predetermined value $+V_3$. This permits the threshold detector circuit 22 to be adjusted to pass voltages slightly above voltage $+V_3$ and also enables the amplitudes of the early and late output pulses at terminals 30 and 32 to be substantially equal except in one special case.

In the special case wherein the arrival time $t_1$ is equal to the arrival time $t_2$, the voltage amplitude produced at terminal 30 will be significantly larger than the voltage amplitude produced at terminal 32. The early and late output pulses will occur at the same time.

It will be understood that the circuit may be modified to distinguish three or more time displaced input signals by providing a summing means capable of summing three or more input signals and by adding one or more additional threshold circuits at terminal 18, each coupled to a pulse shaping circuit similar to circuits 20 and 26. Each threshold circuit must be set to pass a different amplitude signal. Thus, for example, with three input signals, each at amplitude $V_1$, the additional threshold detector circuit (not shown) is sent to reject all signals less than and equal to $2V_1$ volts. As described previously, it is a necessary condition for circuit operation that the early arriving signals be still present when the last signal arrives.

What is claimed is:

1. A circuit for providing a relatively early signal pulse and a relatively late signal pulse at first and second output terminals, respectively, corresponding in time to first arriving and second arriving input signal pulses, each signal being applied to a different one of a pair of input terminals of said circuit, the first pulse being present when the second pulse arrives, comprising:

means responsive to said input pulses for producing, as a function of time, a sum signal pulse having an amplitude directly related to the sum of the respective amplitudes of said output pulses;

means coupled to said summing means for producing at said first output terminal said relatively early pulse in response to the leading edge of said sum pulse; and means coupled to said summing means for producing at said second output terminal said relatively late pulse in response to the amplitude of said sum signal exceeding a known amplitude greater than the amplitude of the first arriving input pulse.

2. The combination as set forth in claim 1 wherein said means producing said early pulse comprises a pulse shaping circuit.

3. The combination as set forth in claim 2 wherein said pulse shaping circuit comprises a step recovery diode.

4. The combination as set forth in claim 1 wherein said means producing said late pulse comprises threshold means responsive to said sum signal for producing a signal corresponding in time to the initial concurrent presence of both input signals at said summing means and further comprises means responsive to said threshold means signal for producing said late pulse.

5. The combination as set forth in claim 4 wherein said means responsive to said threshold means signal comprises a pulse shaping circuit.

6. The combination as set forth in claim 5 wherein said pulse shaping cricuit comprises a step recovery diode.

7. The combination as set forth in claim 4 wherein said threshold means comprises a reverse biased diode.

8. The combination as set forth in claim 7 wherein said reverse biased diode is a Schottky barrier diode.

9. The combination as set forth in claim 1 wherein said summing means comprises a dual gate transistor circuit.

* * * * *